United States Patent [19]

Tajima et al.

[11] Patent Number: 5,847,015

[45] Date of Patent: Dec. 8, 1998

[54] PIGMENT-DISPERSED RADIATION-SENSITIVE COMPOSITION FOR COLOR FILTERS

[75] Inventors: Yusuke Tajima; Nobuo Bessho; Hiroaki Nemoto, all of Yokohama; Fumine Shitani, Izumo, all of Japan

[73] Assignee: JSR Corporation, Tokyo, Japan

[21] Appl. No.: 782,283

[22] Filed: Jan. 13, 1997

Related U.S. Application Data

[63] Continuation of Ser. No. 309,877, Sep. 21, 1994, abandoned.

[30] Foreign Application Priority Data

Sep. 24, 1993 [JP] Japan .................................. 5-261877

[51] Int. Cl.$^6$ ................. C08F 2/50; G03F 9/00; G03F 7/008; G03C 7/12
[52] U.S. Cl. ............... 522/75; 522/81; 522/114; 522/120; 522/121; 430/7
[58] Field of Search .............. 522/81, 75, 120, 522/121; 430/7, 20, 286.1, 288.1, 321

[56] References Cited

U.S. PATENT DOCUMENTS

| | | | |
|---|---|---|---|
| 3,759,875 | 9/1973 | Guthrie | 522/81 |
| 4,234,466 | 11/1980 | Takahashi et al. | 522/81 |
| 4,673,705 | 6/1987 | Ansel et al. | 522/81 |
| 5,061,602 | 10/1991 | Koch et al. | 430/281 |
| 5,096,801 | 3/1992 | Koya et al. | 430/293 |
| 5,190,845 | 3/1993 | Hashimoto et al. | 430/288 |
| 5,368,976 | 11/1994 | Tajima et al. | 430/7 |

FOREIGN PATENT DOCUMENTS 0 564 168   10/1993   European Pat. Off. .

*Primary Examiner*—Susan W. Berman
*Attorney, Agent, or Firm*—Oblon, Spivak, McClelland, Maier & Neustadt, P.C.

[57] ABSTRACT

A radiation-sensitive composition which comprises (A) a binder polymer which is a copolymer comprising (A-1) a monomer containing an alcoholic hydroxyl group, (A-2) a macromonomer, and (A-3) other monomer copolymerizable with the above monomers; (B) a pigment, and (C) a radiation-sensitive compound. This radiation-sensitive composition is suited as a color-dispersed composition for a color filter which does not cause surface soiling and which has an excellent adhesion of a formed pixel to a glass substrate.

8 Claims, No Drawings

PIGMENT-DISPERSED RADIATION-SENSITIVE COMPOSITION FOR COLOR FILTERS

This application is a Continuation of application Ser. No. 08/309,877, filed on Sep. 21, 1994, now abandoned.

DETAILED DESCRIPTION OF THE INVENTION

This invention relates to a radiation-sensitive composition. More specifically, this invention relates to a pigment-dispersed radiation-sensitive composition which has a good dispersibility of a pigment, a good adhesion to a substrate and excellent coating properties, and which is suited for use in formation of a color filter used in a liquid crystal display device or a solid state imaging device.

As a method for producing a color filter of a liquid crystal display device or a solid state imaging device, a dyeing method, a printing method and an electrodeposition method have been hitherto known. In recent years, a lithographic method using a colored radiation-sensitive composition is particularly arousing interest from the aspects of a purity, a dimensional accuracy and a process resistance.

To produce a color filter by the lithographic method using the radiation-sensitive composition, the radiation-sensitive composition is coated onto a black matrix formed on a glass substrate with a spin coater or the like, and dried to form a coating. The coating is then exposed to light and developed to obtain a colored pixel. This process is repeated several times using radiation-sensitive compositions different in color to give a color filter. However, a pixel obtained by using the conventional radiation-sensitive composition is easily peeled off from the substrate, and tends to give the color filter a deficiency. When adhesion of a pixel to a substrate is improved to eliminate this deficiency, solubility of a non-pixel portion to be dissolved away in a developer solution in the development tends to decrease, and so-called surface soiling and film remaining are prone to occur.

As a technique to solve such problems, Laid-open European Patent No. 0564168A2 proposes a radiation-sensitive composition for use in a color filter containing an alkali-soluble block copolymer of a specific structure as a binder, a radiation-sensitive compound and a pigment.

It is an object of this invention to provide a novel pigment-dispersed radiation-sensitive composition.

Another object of this invention is to provide a pigment-dispersed radiation-sensitive composition which does not cause the surface soiling, which is excellent in adhesion of a formed pixel to a glass substrate, and which is suited for use in formation of a color filter.

Still another object of this invention is to provide a pigment-dispersed radiation-sensitive composition which does not cause the surface soiling on a black matrix and a glass substrate, which gives a pixel excellent in adhesion to the black matrix and the glass substrate, which is excellent in coating properties, and which is suited for use in formation of a color filter.

The other objects and advantages of this invention will be made clear from the following explanation.

In accordance with this invention, the objects and advantages of this invention are achieved by a radiation-sensitive composition which comprises:

(A) a binder polymer which is a copolymer comprising
(A-1) a monomer containing an alcoholic hydroxyl group,
(A-2) a macromonomer, and
(A-3) other monomer copolymerizable with the above monomers,
(B) a pigment, and
(C) a radiation-sensitive compound.

The word "radiation" referred to in this invention is used under a concept that this word includes a visible light, an ultraviolet light, an electron beam and X-rays.

The composition of this invention will be explained in detail below.

(A) Binder polymer:

In this invention, a copolymer comprising a monomer containing an alcoholic hydroxyl group (A-1) (hereinafter referred to as "(A-1)"), a macromonomer (A-2) (hereinafter referred to as "(A-2)"), and a comonomer copolymerizable with the above monomers (A-3) (hereinafter referred to as "(A-3)") is used as the binder polymer (A).

(A-1) is preferably an unsaturated compound containing at least one alcoholic hydroxyl group in the molecule. Specific examples of (A-1) include 2-hydroxyethyl (meth) acrylate, 2-hydroxypropyl (meth)acrylate, N-hydroxymethylacrylamide, 2-hydroxy-3-phenoxypropyl acrylate, polyethylene glycol mono(meth)acrylate and polypropylene glycol mono(meth)acrylate. Of these, 2-hydroxyethyl methacrylate is especially preferable as.(A-1).

To obtain intended properties, the binder polymer (A) is a block copolymer having (A-2) as a copolymer component of the binder polymer (A), which is one of the characteristic features of this invention. (A-2) is preferably a compound having preferably one polymerizable carbon-carbon double bond in the molecule and having a number average molecular weight (hereinafter referred to as "Mn"), calculated as polystyrene, of 1,000 to 10,000, especially 2,000 to 8,000.

Such (A-2) is a homopolymer or a copolymer at least one monomer selected from the group consisting of styrene, an alkyl (meth)acrylate, acrylonitrile, vinyl acetate, butadiene and isoprene, said homopolymer or copolymer having a (meth)acryloyl group at one terminal of the molecule.

Specific examples of such (A-2) preferably include a macromonomer having a (meth)acryloyl group at one terminal of the molecule, such as a polystyrene oligomer, a polymethyl (meth)acrylate oligomer or a polybutyl (meth) acrylate oligomer. Commercial products which can be easily obtained are AS-6 (polystyrene oligomer having a (meth) acryloyl group at one terminal of the molecule, made by Toa Gosei Chemical Industry Co., Ltd., Mn=6,000), AA-6 (polymethyl methacrylate oligomer having a (meth)acryloyl group at one terminal of the molecule, made by Toa Gosei Chemical Industry Co., Ltd., Mn=about 6,000) and AB-6 (polybutyl acrylate oligomer having a (meth)acryloyl group at one terminal of the molecule, made by Toa Gosei Chemical Industry Co., Ltd., Mn=6,000).

Further, a polysilicone oligomer having a (meth)acryloyl group at one terminal of the molecule is also preferably used as (A-2).

(A-3) is a monomer copolymerizable with both (A-1) and (A-2). Preferred examples of (A-3) include unsaturated carboxylic acids, aromatic vinyl compounds, unsaturated carboxylic acid alkyl esters, unsaturated carboxylic acid arylalkyl esters, unsaturated carboxylic acid aminoalkyl esters, unsaturated carboxylic acid glycidyl esters, carboxylic acid vinyl esters, vinyl cyanates and aliphatic conjugated dienes.

Specific examples of such (A-3) include unsaturated carboxylic acids such as (meth)acrylic acid, crotonic acid, itaconic acid, maleic acid and fumaric acid; aromatic vinyl compounds such as styrene, α-methylstyrene and vinyltoluene; unsaturated carboxylic acid alkyl esters such as methyl (meth)acrylate, ethyl (meth)acrylate and butyl (meth) acrylate; unsaturated carboxylic acid arylalkyl esters such as benzyl (meth)acrylate; unsaturated carboxylic acid aminoalkyl esters such as aminoethyl acrylate; unsaturated carboxylic acid glycidyl esters such as glycidyl (meth) acrylate; carboxylic acid vinyl esters such as vinyl acetate and vinyl propionate; vinyl cyanates such as (meth) acrylonitrile and α-chloroacrylonitrile; and aliphatic conjugated dienes such as 1,3-butadiene and isoprene.

Of these, the unsaturated carboxylic acids, the (meth) acrylic acid alkyl esters, the unsaturated carboxylic acid arylalkyl esters and the carboxylic acid vinyl esters are preferable.

These (A-1), (A-2) and (A-3) are used either singly or in combination.

The amount of (A-1) in the binder polymer (A) is preferably 5 to 30 parts by weight, more preferably 10 to 20 parts by weight per 100 parts by weight of all the monomers. The amount of (A-2) is preferably 1 to 50 parts by weight, more preferably 5 to 20 parts by weight per 100 parts by weight of all the monomers. The amount of (A-3) is a balance of the amounts of (A-1) and (A-2).

Specific examples of the binder polymer (A) include a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macropolymer/methyl methacrylate/methacrylic acid copolymer, and a 2-hydroxyethyl methacrylate/polystyrene macromonomer/benzyl methacrylate/methacrylic acid copolymer.

An adhesion of a formed pixel to a black matrix and a glass substrate can be improved by introducing the alcoholic hydroxyl group via (A-1) into the binder polymer (A).

The use of (A-1) in the above amount further improves the adhesion of the formed pixel to the substrate and makes it hard to cause the surface soiling on the black matrix and the glass substrate in the non-pixel portion.

The binder polymer (A) is a graft polymer having (A-2) as the copolymer component. This enables to increase an affinity for a pigment and remarkably to improve a uniformity of a coating and a solubility of a non-pixel portion that is developed with an alkali. The binder polymer (A) further has (A-3) as the copolymer component, making it possible to adjust a solubility of the binder polymer (A) in alkali and increase a film formability and a heat resistance.

The binder polymer (A) used in this invention has a weight average molecular weight (hereinafter referred to as "Mw"), calculated as polystyrene, of preferably 5,000 to 50,000, more preferably 10,000 to 30,000, measured by gel permeation chromatography (carrier: tetrahydrofuran).

The binder polymer (A) having such Mw can be obtained by radical-polymerizing (A-1), (A-2) and (A-3) in the presence of a solvent. On that occasion, a chain transfer agent can be used. As the chain transfer agent, an a-methylstyrene dimer is preferable because color change by heat less occurs in producing a color filter from the composition of this invention that contains the binder polymer (A). The α-methylstyrene dimer is used in an amount of 0.01 to 20 parts by weight, more preferably 0.1 to 10 parts by weight per 100 parts by weight of all the monomers.

Examples of the α-methylstyrene dimer include the following isomers, (a) 2,4-diphenyl-4-methyl-1-pentene,
(b) 2,4-diphenyl-4-methyl-2-pentene, and
(c) 1,1,3-trimethyl-3-phenylindane.

A preferable composition of the a-methylstyrene dimer as the chain transfer agent is that when the total amount is 100 parts by weight, the amount of the component (a) is 40 parts by weight or more, and the amount of the component (b) and/or the component (c) is 60 parts by weight or less. A more preferable composition of the α-methylstyrene dimer is that the amount of the component (a) is 50 parts by weight or more, and the amount of the component (b) and/or the component (c) is 50 parts by weight or less.

(B) Pigment:

In this invention, organic or inorganic pigments are used as the pigment (B).

The organic pigments are dyes or pigments insoluble in water or an organic solvent. Specific examples of the organic pigment include compounds which are grouped into pigments shown in a color index (published by The Society of Dyers and Colourists).

The inorganic pigments are metallic compounds, i.e., metal oxides and metal complex salts. Examples thereof include oxides of metals such as iron, cobalt, aluminum, cadmium, lead, copper, titanium, magnesium, chromium, zinc and antimony, and complex oxides of said metals.

Specific examples of the pigment (B) include compounds with the following color index CI numbers.

C.I. Pigment Yellow 24, C.I. Pigment Yellow 31,
C.I. Pigment Yellow 53, C.I. Pigment Yellow 83,
C.I. Pigment Orange 43, C.I. Pigment Red 105,
C.I. Pigment Red 149, C.I. Pigment Red 176,
C.I. Pigment Red 177, C.I. Pigment Violet 14,
C.I. Pigment Violet 29, C.I. Pigment Blue 15,
C.I. Pigment Blue 15:3, C.I. Pigment Blue 15:6,
C.I. Pigment Blue 22, C.I. Pigment Blue 28,
C.I. Pigment Green 15, C.I. Pigment Green 25,
C.I. Pigment Green 36, C.I. Pigment Brown 28,
C.I. Pigment Black 1, C.I. Pigment Black 7,
C.I. Pigment Yellow 109, C.I. Pigment Yellow 110,
C.I. Pigment Violet 23, C.I. Pigment Green 7.

These pigments can be used either singly or in combination.

In this invention, the pigment (B) is used in an amount of usually 10 to 1,000 parts by weight, preferably 20 to 500 parts by weight per 100 parts by weight of the binder polymer (A).

(C) Radiation-sensitive compound:

The radiation-sensitive compound (C) used in this invention is (1) a compound that allows a polymerization chain transfer reaction of a polymerizable carbon-carbon double bond or (2) a compound that enters in a carbon-carbon bond or a carbon-hydrogen bond to form a crosslinked structure between molecules by, upon irradiation with radiation, absorbing the energy to generate active seeds such as a radical, nitrene and methylene in the electronically excited state.

The compound (1) is, for example, a compound that generates the radical upon irradiation with radiation, i.e., a compound having an unsaturated double bond which is polymerized upon irradiation with radiation, such as a radiation polymerization initiator or a radiation-polymerizable monomer or oligomer.

Examples of the radiation polymerization initiator include:

carbonium compounds such as diacetyl, benzyl, benzoin, 2-hydroxy-2-methyl-1-phenylpropan-1-one, 1-(4-isopropylphenyl)-2-hydroxy-2-methylpropan-1-one, 4-(2-hydroxyethoxy)phenyl-(2-hydroxy-2-propyl) ketone, 1-hydroxycyclohexylphenylketone, 2,2-dimethoxy-2- phenylacetophenone, 2-methyl-1-(4-methylthiophenyl)-2-morphorino-1-propan-1-one, 2-benzyl-2-dimethylamino-1-(4-morpholinophenyl)-butan-1-one, benzophenone, 4,4'-bis(dimethylamino)benzophenone, 4,4'-bis(diethylamino)benzophenone, 2,4-diethylthioxanthone and 3,3-diethyl-4-methoxybenzophenone;

azo compounds and azido compounds such as azobisisobutyronitrile, diazonium, 4-azidobenzaldehyde, 4-azidoacetophenone, 4-azidobenzalacetophenone, 4-azidobenzalacetone, azidopyrene, 4-diazodiphenylamine, 4-diazo-4'-methoxydiphenylamine and 4-diazo-3'-methoxydiphenylamine;

organic sulfur compounds such as mercaptane disulfide;

peroxides such as diethyl ether peroxide; and trihalomethane compounds such as 1,3-bis(trichloromethyl)-5-(2'-chlorophenyl)-s-triazine and 1,3-bis(trichloromethyl)-5-(4'-methoxyphenyl)-s-triazine.

Examples of the radiation-polymerizable monomer or oligomer include polyvalent acrylates such as trimethylolpropane triacrylate, pentaerythritol triacrylate, trisacryloyloxyethyl phosphate, pentaerythritol tetracrylate, dipentaerythritol pentacrylate and dipentaerythritol hexacrylate; a condensate of 4-azidobenzaldehyde and polyvinyl alcohol, a condensate of 4-azidobenzaldehyde and a phenolic novolac resin, and a polymer or a copolymer of 4-acryloylphenylcinnamoyl ester.

The radiation-polymerizable monomer or oligomer can be used in such an amount as not to impair the objects and the effects of this invention so long as the composition of this invention can form a coating having an adhesion upon irradiation with radiation.

The compound (2) is a compound containing at least 2 functional groups that generate a radical, carbene and nitrene upon irradiation with radiation, i.e., a radiation crosslinking agent.

Examples of the radiation crosslinking agent include diazidocalcon, 2,6-bis(4'-azidobenzal)-cyclohexanone, 1,3-bis(4'-azidobenzal)-4-methylcyclohexanone, 1,3-bis(4'-azidobenzal)-2-propane, 1,3-bis(4'-azidocinnamylidene)-2-propane, 4,4'-diazidostilbene and ammonium dichromate.

Among these radiation-sensitive compounds, it is advisable to use a combination of the compound generating the radical upon irradiation with radiation, which is the radiation polymerization initiator, with the radiation-polymerizable monomer, especially the polyvalent acrylate.

This combination is, for example, a combination of 2-methyl-1-(4-methylthiophenyl)-2-morpholinopropan-1-one, 1-hydroxycyclohexylphenylketone or 2-benzyl-2-dimethylamino-1-(4-morphorinophenyl)-butan-1-one as the radiation polymerization initiator and pentaerythritol triacrylate or dipentaerythritol hexacrylate as the radiation-polymerizable monomer. On this occasion, the radiation polymerization initiator is used in an amount of 0.01 to 200 parts by weight, preferably 1 to 120 parts by weight, per 100 parts by weight of the radiation-polymerizable monomer.

The radiation-sensitive compound is used in an amount of usually 10 to 200 parts by weight, preferably 20 to 150 parts..by weight per 100 parts by weight of the binder polymer (A). When the amount is less than 10 parts by weight, a vividness of a pixel tends to be insufficient. When the amount exceeds 200 parts by weight, the film-remaining easily occurs on a non-pixel portion.

The composition of this invention can contain, as required, a variety of additives such as a filler, a polymeric compound other than the binder polymer (A), a surface active agent, an adhesion promoter, an antioxidant, an ultraviolet absorber and an agglomeration preventing agent.

Specific examples of these additives are as follows. Specific examples of the filler include a glass and alumina. Specific examples of the polymeric compound other than the binder polymer (A) include polyvinyl alcohol, polyacrylic acid, polyethylene glycol monoalkyl ether and polyfluoroalkyl acrylate. Specific examples of the surface active agent include nonionic, cationic and anionic surface active agents. Specific examples of the adhesion promoter include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane. Specific examples of the antioxidant include 2,2-thiobis(4-methyl-6-tert-butylphenol) and 2,6-di-tert-butylphenol. Specific examples of the ultraviolet absorber include 2-(3-tert-butyl-5-methyl-2-hydroxyphenyl)-5-chlorobenzotriazole and alkoxybenzophenone. Specific examples of the agglomeration preventing agent include sodium polyacrylate.

In order to accelerate a solubility of a non-radiation-irradiated portion in alkali and improve a developability of the composition of this invention, the composition of this invention can contain an organic carboxylic acid, preferably an organic carboxylic acid having a low molecular weight of 1,000 or less. Specific examples of the organic carboxylic acid include aliphatic monocarboxylic acids such as formic acid, acetic acid, propionic acid, butyric acid, valeric acid, pivalic acid, caproic acid, diethyl acetate, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoric acid; aromatic monocarboxylic acids such as benzoic acid, toluic acid, cuminic acid, hemellitic acid and mesitylenic acid; aromatic polycarboxylic acids such as phthalic acid, isophthalic acid, terephthalic acid, trimellytic acid, trimesic acid, mellophanic acid and pyromellitic acid; and other carboxylic acids such as phenylacetic acid, hydroatropic acid, hydrocinnamic acid, mandelic acid, phenylsuccinic acid, atropic acid, cinnamic acid, methylcinnamic acid, benzylcinnamic acid, cynnamylideneacetic acid, coumaric acid and umbellic acid. Of these organic carboxylic acids, preferred are itaconic acid, malonic acid, citraconic acid, mesaconic acid, fumaric acid and phthalic acid.

The composition of this invention can be prepared by mixing and dispersing the binder polymer (A), the pigment (B) and the radiation-sensitive compound (C) and as required, the other components in the presence of a solvent using, for example, a ball mill, a pebble mill, a shaker, a homogenizer, a triple roll mill, a sand mill or a nanomizer.

The composition of this invention can be also prepared by dispersing the pigment (B), e.g., a pigment having an average particle diameter of 1 $\mu$m or less in a dispersion medium containing a dispersant and a solvent (preliminary dispersing step), then dispersing the thus-obtained preliminary dispersion at high pressure of 100 kg/cm$^2$ or more (high pressure dispersing step), adding the binder polymer (A) and the radiation-sensitive compound (C) and as required, the other components to the thus-prepared pigment dispersion, and mixing them with the above-mentioned dispersing device. This method can reduce depolarization (scattering of a polarized light) of a color filter.

There are a large number of dispersants which can be used in the preliminary dispersing step. Specific examples thereof include phthalocyanine derivatives (EFKA-745, a trade name for a produce of Morishita & Co., Ltd); cationic surface active agents such as an organosiloxane polymer KP341 (a trade name for a product of The Shin-etsu Chemical Industry Co., Ltd.), (meth)acrylic acid-containing copolymers Polyflow No.75, No. 90, No. 95 (trade names for products of Kyoeisha Chemical Co., Ltd.), and W001 (a trade name for a product of Yusho Co., Ltd.); nonionic surface active agents such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate and sorbitan aliphatic acid ester; fluorine-containing surface active agents such as EFTOP EF301, EF303, EF352 (trade names for products of Tohkem Products Co., Ltd), Megafac F171, F172, F173 (trade names for products of Dainippon Ink & Chemicals, Inc.), Fluorad FC430, FC431 (trade names for products of Sumitomo 3M, Ltd.), ASAHI GUARD AG710, Surflon S-382, SC-101, SC-102, SC-103, SC-104, SC-105, SC-1068 (trade names for products of Asahi Glass Co., Ltd.); anionic surface active agents such as W004, W005, W017 (trade names for products of Yusho Co., Ltd.), high-molecular dispersants such as EFKA-46, EFKA-47, EFKA-47EA, EFKA Polymer 100, EFKA Polymer 400, EFKA Polymer 401, EFKA Polymer 450 (trade names for products of Morishita & Co., Ltd.), Disperse Aid 6, Disperse Aid 8, Disperse Aid 15, Disperse Aid 9100 (trade names for products of San Nop Co., Ltd.); and IONET S-20 (a trade name for a product of Sanyo Chemical Industries, Ltd.).

These dispersants may be used either singly or in combination.

The dispersant which is contained in the pigment dispersion is used in an amount of usually 0.1 to 50 parts by weight per 100 parts by weight of the pigment.

Examples of the solvent used to prepare the composition of this invention include:

esters such as ethyl acetate, n-butyl acetate, isobutyl acetate, amyl formate, isoamyl acetate, isobutyl acetate, butyl propionate, isopropyl butyrate, ethyl butyrate, butyl butyrate; alkyl esters such as methyl lactate, ethyl lactate, methyl hydroxyacetate, ethyl hydroxyacetate, butyl hydroxyacetate, methyl methoxyacetate, ethyl methoxyacetate, butyl methoxyacetate, ethyl ethoxyacetate, ethyl ethoxyacetate; 3-hydroxypropionic acid alkyl esters such as methyl 3-hydroxypropionate, ethyl 3-hydroxypropionate, methyl 3-methoxypropionate, ethyl 3-methoxypropionate, methyl 3-ethoxypropionate, ethyl 3-ethoxypropionate, methyl 2-hydroxypropionate, ethyl 2-hydroxypropionate, propyl 2-hydroxypropionate, methyl 2-methoxypropionate, ethyl 2-methoxypropionate, propyl 2-methoxypropionate, methyl 2-ethoxypropionate, ethyl 2-ethoxypropionate, methyl 2-hydroxy-2-methylpropionate, ethyl 2-hydroxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-hydroxybutyrate and ethyl 2-hydroxybutyrate;

ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate and propylene glycol propyl ether acetate;

ketones such as methyl ethyl ketone, cyclohexanone, 2-heptanone and 3-heptanone; and aromatic hydrocarbons such as toluene and xylene.

Of these compounds, preferred are methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate and propylene glycol methyl ether acetate.

These solvents may be used either singly or in combination.

The solvent is used in an amount of usually 100 to 4,000 parts by weight, preferably 200 to 2,000 parts by weight per 100 parts by weight of the pigment.

In the preliminary dispersing step, the pigment is dispersed in the dispersion medium containing the dispersant and the solvent.

The dispersing is usually conducted with a dispersing device or a kneading device such as a ball mill, a dissolver, a homomixer, a kneader, a triple roll mill or a sand mill.

Of these, the triple roll mill or the sand mill is preferably used.

In the preliminary dispersion obtained in the preliminary dispersing step, the pigment having an average particle diameter of preferably 1 $\mu$m or less is dispersed.

The average particle diameter of the pigment is more preferably 0.05 to 0.7 $\mu$m, especially preferably 0.05 to 0.4 $\mu$m.

When a viscosity of the preliminary dispersion is high, a workability of the subsequent high-pressure dispersing step sometimes decreases. Accordingly, the viscosity of the preliminary dispersion is 50,000 cps or less, preferably 20,000 cps or less, more preferably 10,000 cps or less.

In the preliminary dispersing step, in addition to the pigment, the dispersant and the solvent, the other components may be contained, as required, in the preliminary dispersion.

In the high-pressure dispersing step, the preliminary dispersion is subjected to a dispersing treatment under pressure of 100 kg/cm$^2$ or more, preferably 300 kg/cm$^2$ or more.

The dispersing treatment is conducted, for example, under the above high pressure with a high-pressure dispersing device that allows liquid-liquid impinging at high speed, e.g., a microfluidizer (manufactured by Microfluidics), ULTIMIZER (manufactured by Hosokawa Micron K. K.) or T. K. NANOMIZER (manufactured by Tokushu Kika Kogyo K. K.).

In the thus-obtained pigment dispersion, it is desirable that the pigment has the average particle diameter of 0.05 to 0.7 $\mu$m, preferably 0.05 to 0.4 $\mu$m.

The viscosity of the pigment dispersion is 50,000 cps or less, preferably 20,000 cps or less, more preferably 10,000 or less.

In the high-pressure dispersing step, the other components which are used as required can be contained in the pigment dispersion.

The above-obtained pigment dispersion has the excellent dispersibility of the pigment without agglomeration of the pigment particles and can maintain the dispersed state of the pigment even if stored for a long period.

The composition of this invention is prepared by adding the components for forming the composition of this invention, i.e., the binder polymer (A) and the radiation-sensitive compound (C) to the above-obtained pigment dispersion, and mixing them with the high-pressure dispersing device such as abovementioned.

The composition of this invention is coated on a substrate by coating such as rotation coating, cast coating or roll coating to form a radiation-sensitive composition layer, and the radiation-sensitive composition layer is exposed to light through a predetermined mask pattern and developed with a developer to form a colored pattern. Radiation which is used on this occasion is especially preferably ultraviolet rays such as g rays and i rays.

Examples of the substrate include a soda glass used in a liquid crystal display device, a pyrex glass, a quartz glass, these glasses having a clear electroconductive film deposited thereon, and a photoelectric converter substrate used in a solid state imaging device, such as a silicon substrate.

Black stripes by which to partition pixels are generally formed on the substrate.

As the developer, an alkaline aqueous solution is used in which an alkaline compound is dissolved in an amount of 0.001 to 10% by weight, preferably 0.01 to 1% by weight. Examples of the alkaline compound include sodium hydroxide, potassium hydroxide, sodium carbonate, sodium silicate, sodium metasilicate, aqueous ammonia, ethylamine, diethylamine, diethylethanolamine, tetramethylammonium hydroxide, tetraethylammonium hydroxide, choline, pyrrole, piperidine and 1,8-diazabicyclo-[5,4,0]-7-undecene.

When the developer formed of such an alkaline aqueous solution is used, the substrate is generally rinsed with water after the development.

This invention will be illustrated more specifically by referring to the following Examples. However, this invention is not limited to these Examples. In the Examples, % is % by weight, and parts are Parts by weight.

Synthesis Example 1:

|  | parts |
|---|---|
| ethyl 3-ethoxypropionate | 300 |
| 2-hydroxyethyl methacrylate | 15 |
| polystyrene having a methacryloyl group at one terminal of the molecule (*1) | 10 |
| benzyl methacrylate | 60 |
| methacrylic acid | 15 |
| azobisisobutyronitrile | 1 |
| α-methylstyrene dimer (*2) | 5 |

(*1) Macromonomer AS-6 made by Toa Gosei Chemical Industry Co., Ltd., a polystyrene oligomer having a methacryloyl group at one terminal of the molecule, a molecular weight = 6,000
(*2) containing 2,4-diphenyl-4-methyl-1-pentene (88.9%), 2,4-diphenyl-4-methyl-2-pentene (3.4%) and 1,1,3-trimethyl-3-phenylindane (0.8%) as main ingredients.

The above raw materials were charged into an autoclave equipped with a stirrer, and stirred at room temperature until a uniform mixture was obtained. Then, the temperature was elevated to 80° C. Thereafter, the temperature was maintained at 80° C. for 3 hours, and then at 100° C. for 2 hours. The mixture was cooled to room temperature to obtain a polymer solution A. During this time, nitrogen was passed through the inside of the autoclave to shut off air and stirring continued. The polymerization yield of the polymer solution A (concentration of the polymer 30% by weight) was 98%. Mw of the polymer (hereinafter referred to as a "polymer A") in the polymer solution A was 25,000 (as measured with HLC-802A manufactured by Tosoh Corporation).

EXAMPLE 1:

|  | parts |
|---|---|
| C.I. Pigment Red 177 | 80 |
| C.I. Pigment Yellow 83 | 20 |
| pentaerythritol triacrylate | 90 |
| 1-hydroxycyclohexylphenylketone | 30 |
| polymer solution A in Synthesis Example 1 | 400 |
| glycidyloxypropyltrimethoxysilane | 2 |
| ethyl 3-ethoxypropionate | 1200 |

The above raw materials were mixed and dispersed with a ball mill. The dispersion was filtered with a filter (having a performance to cut a foreign matter having a particle diameter of 2.5 μm by 95%) to obtain a dispersion of a composition of this invention.

This dispersion was coated on a glass substrate having formed thereon a black matrix made of chromium to a dry film thickness of 2 μm with a spin-coater, and the thus-coated substrate was dried at 80° C. for 10 minutes to obtain a red uniform coating.

Further, the above-coated substrate was irradiated with 100 mJ/cm$^2$ of a light energy by means of a high-pressure mercury arc lamp through a photomask having a mask hole width of 10 to 100 μm for evaluation of resolution, developed with a 0.1% aqueous solution of tetramethylammonium hydroxide, rinsed with water, and then dried at 180° C. for 1 hour.

The thus-obtained pixel had a pattern of fine lines having a width of 10 to 100 μm. The pattern was, when observed with an optical microscope, a pattern having sharp edges. Further, the non-pixel portion was free from the surface soiling. Still further, even if a pattern of fine lines having a width of 5 μm or less was formed, delamination did not occur, and the pixel was one which can be suitably used in a color filter of high accuracy.

EXAMPLE 2:

|  | parts |
|---|---|
| C.I. Pigment Red 177 | 80 |
| C.I. Pigment Yellow 83 | 20 |
| pentaerythritol triacrylate | 90 |
| 1-hydroxycyclohexylphenylketone | 30 |
| polymer solution A in Synthesis Example 1 | 400 |
| glycidyloxypropyltrimethoxysilane | 2 |
| malonic acid | 3 |
| ethyl 3-ethoxypropionate | 1200 |

The above raw materials were mixed and dispersed with a ball mill. The dispersion was filtered with a filter (having a performance to cut a foreign matter having a particle diameter of 2.5 μm by 95%) to obtain a dispersion of a composition of this invention.

This dispersion was coated on a glass substrate having formed thereon a black matrix made of chromium to a dry film thickness of 2 μm with a spin-coater, and the thus-coated substrate was dried at 80° C. for 10 minutes to obtain a red uniform coating.

Further, the above-coated substrate was irradiated with 100 mJ/cm$^2$ of a light energy by means of a high-pressure mercury arc lamp through a photomask having a mask hole width of 10 to 100 μm for evaluation of resolution, developed with a 0.1% aqueous solution of tetramethylammonium hydroxide, rinsed with water, and then dried at 180° C. for 1 hour.

The thus-obtained pixel had a pattern of fine lines having a width of 10 to 100 μm. The pattern was, when observed with an electron microscope, a pattern having sharp edges. Further, the non-pixel portion was free from the surface soiling. Still further, even if a pattern of fine lines having a width of 5 μm or less was formed, delamination did not occur, and the pixel was one which can be suitably used in a color filter of high accuracy.

EXAMPLE 3:

|  | parts |
| --- | --- |
| C.I. Pigment Green 36 | 75 |
| C.I. Pigment Yellow 83 | 25 |
| IONET S-20 (*1) | 10 |
| ethyl 3-ethoxypropionate | 190 |

(*1) Dispersant made by Sanyo Chemical Industries, Ltd.

The above raw materials were mixed for 1 hour with a dissolver, and the mixture was further charged into a high-pressure dispersing device (T. K. Nanomizer, a trade name for a device manufactured by Tokushu Kika Kogyo K. K.) where said mixture was dispersed at high pressure of 1,000 kg/cm². There was obtained a pigment dispersion.

|  | parts |
| --- | --- |
| pigment dispersion | 300 |
| dipentaerythritol hexacrylate | 90 |
| 2-benzyl-2-dimethylamino-1-(4-morpholinophenyl)-butan-1-one | 40 |
| polymer solution A in Synthesis Example 1 | 400 |
| glycidyloxypropyltrimethoxysilane | 2 |
| citraconic acid | 3 |
| ethyl 3-ethoxypropionate | 1000 |

The above raw materials were mixed and dispersed with a ball mill. The dispersion was filtered with a filter (having a performance to cut a foreign matter having a particle diameter of 2.5 μm by 95%) to obtain a dispersion of a composition of this invention.

This dispersion was coated on a glass substrate having formed thereon a black matrix made of chromium to a dry film thickness of 2 μm with a spin-coater, and the thus-coated substrate was dried at 80° C. for 10 minutes to obtain a green uniform coating.

Further, the above-coated substrate was irradiated with 100 mJ/cm² of a light energy by means of a high-pressure mercury arc lamp through a photomask having a mask hole width of 10 to 100 μm for evaluation of resolution, developed with a 0.1% aqueous solution of tetramethylammonium hydroxide, rinsed with water, and then dried at 180° C. for 1 hour.

The thus-obtained pixel had a pattern of fine lines having a width of 10 to 100 μm without depolarization (scattering of a polarized light). The pattern was, when observed with an optical microscope, a pattern having sharp edges. Further, the non-pixel portion was free from the surface soiling. Still further, even if a pattern of fine lines having a width of 5 μm or less was formed, delamination did not occur, and the pixel was one which can be suitably used in a color filter of high accuracy.

The pigment-dispersed radiation-sensitive composition of this invention can provide a pixel of high accuracy by a photolithographic method, does not cause the surface soiling on the black matrix and the glass substrate, gives a pixel excellent in adhesion to the black matrix and the glass substrate, is excellent in coating properties, and is suited for use in a color filter.

Consequently, the pigment-dispersed radiation-sensitive composition of this invention can be suitably used in the production of color filters including a color filter for coloration of a liquid crystal display device and a color filter for color resolution of a solid state imaging device in an electronic industry.

What we claim is:

1. A radiation-sensitive composition, which comprises:
    (A) a binder polymer which is at least one member selected from the group consisting of
        a 2-hydroxypropyl(meth) acrylate/polystyrene macromonomer/benzyl methacrylate/methacrylic acid copolymer,
        a 2-hydroxy-3-phenoxypropyl acrylate/polymethylmethacrylate macromonomer/benzyl methacrylate/methacrylic acid copolymer, and
        a 2-hydroxyethyl methacrylate/polystyrene macromonomer/benzyl methacrylate/methacrylic acid copolymer;
    (B) a pigment;
    (C) a radiation-sensitive compound, comprising:
        (C-1) a combination of:
            (C-1-a) a radiation-polymerization initiator, and
            (C-1-b) a radiation-polymerizable monomer or oligomer, or
        (C-2) a radiation crosslinking agent; and optionally,
    (D) an organic carboxylic acid containing at least one acid group in the molecule and having a molecular weight of 1,000 or less.

2. The radiation-sensitive composition of claim 1, wherein the copolymer is obtained by radical polymerization in the presence of an α-methylstyrene dimer as a chain transfer agent.

3. The radiation-sensitive composition of claim 1, which contains the organic carboxylic acid (D), and which organic carboxylic acid is selected from the group consisting of itaconic acid, malonic acid, citraconic acid, mesaconic acid, fumaric acid and phthalic acid.

4. The radiation-sensitive composition of claim 1, wherein the binder polymer has a weight average molecular weight, calculated as polystyrene, of 5,000 to 50,000.

5. The radiation-sensitive composition of claim 1, wherein the pigment (B) is used in an amount of 10 to 1,000 parts by weight per 100 parts by weight of the binder polymer (A), and the total amount of the radiation polymerization initiator and the radiation-polymerizable monomer or oligomer is 20 to 150 parts by weight per 100 parts by weight of the binder polymer (A).

6. The radiation-sensitive composition of claim 1, wherein (C-1-b), the radiation-polymerizable monomer, is a polyacrylate.

7. The radiation-sensitive composition of claim 1, wherein (C-1), the combination of (C-1-a), the radiation polymerization initiator, and (C-1-b), the radiation-polymerizable monomer, is a combination of 2-methyl-1-(4-methyl thiophenyl)-2-morpholinopropan-1-one, 1-hydroxycyclohexyl-phenylketone or 2-benzyl-2-dimethylamino-1-(H-morpholino phenyl)-butan-1-one as the radiation polymerization initiator and pentaerythritol triacrylate or dipentaerythritol hexacrylate as the radiation-polymerization monomer.

8. The radiation-sensitive composition of claim 1, wherein (C-1-a), the radiation polymerizable initiator, is used in an amount of 0.01 to 200 parts by weight per 100 parts by weight of the radiation-polymerizable monomer.

* * * * *